United States Patent [19]
Kowalski

[11] Patent Number: 5,394,359
[45] Date of Patent: Feb. 28, 1995

[54] MOS INTEGRATED CIRCUIT WITH ADJUSTABLE THRESHOLD VOLTAGE

[75] Inventor: Jacek Kowalski, Trets, France

[73] Assignee: Gemplus Card International, Gemenos, France

[21] Appl. No.: 944,811

[22] Filed: Sep. 14, 1992

Related U.S. Application Data

[63] Continuation of Ser. No. 784,971, Oct. 30, 1991, abandoned, which is a continuation of Ser. No. 551,946, Jul. 11, 1990, abandoned.

[30] Foreign Application Priority Data

Jul. 20, 1989 [FR] France ................ 89 09780

[51] Int. Cl.⁶ .................................................. G11C 7/00
[52] U.S. Cl. ................................ 365/185; 365/189.09; 365/218
[58] Field of Search ............ 365/185, 218, 201, 189.6, 365/189.06, 189.07, 189.08, 189.11, 189.09; 357/23.5; 307/360, 361, 362, 363, 364, 350, 351, 352, 296.6, 296.1; 323/349, 313, 312

[56] References Cited

U.S. PATENT DOCUMENTS

| | | | |
|---|---|---|---|
| 4,063,224 | 12/1977 | Kirschner | 365/184 |
| 4,336,603 | 6/1982 | Kotecha et al. | 365/185 |
| 4,357,571 | 11/1982 | Roessler | 323/313 X |
| 4,442,447 | 4/1984 | Ipri et al. | 365/185 |
| 4,542,485 | 9/1985 | Iwahashi et al. | 365/189.09 |
| 4,577,215 | 3/1986 | Stewart et al. | 365/185 |
| 4,888,630 | 12/1989 | Paterson | 365/185 |
| 4,999,813 | 3/1991 | Ohtsuka et al. | 365/189.06 |

Primary Examiner—Eugene R. LaRoche
Assistant Examiner—Vu Le
Attorney, Agent, or Firm—Roland Plottel

[57] ABSTRACT

The MOS cell with adjustable threshold voltage is a cell of the type with a memory that is electrically-erasable and programmable by storage of charges by tunnel effect in a floating gate. To obtain a circuit with adjustable threshold voltage, the cell is first of all "programmed" at zero so that all the charges that may be stored are removed and then it is "erased", with its source grounded, its drain taken to the high potential and its control gate taken to the potential desired for the threshold voltage $V_T$ of the circuit. At the end of this phase, the threshold voltage is adjusted. This device can be applied notably to circuits requiring precise voltage references in MOS technology, namely circuits of the detector or analog-digital converter type.

8 Claims, 2 Drawing Sheets

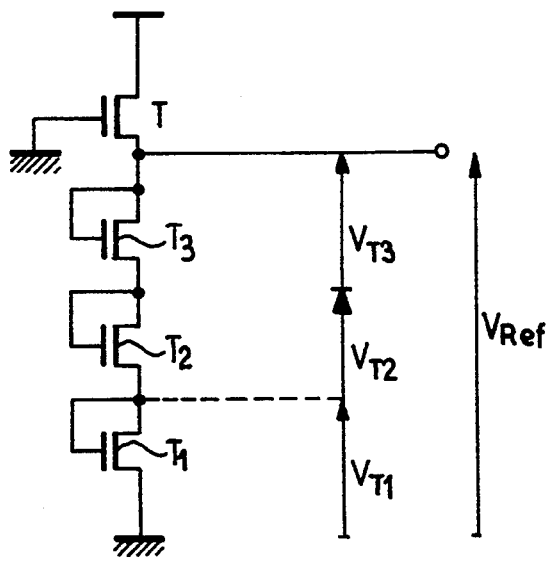
FIG_1
PRIOR ART
FIG_2a
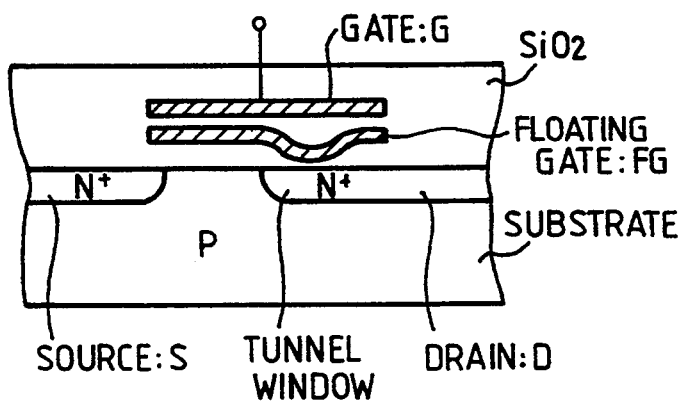
FIG_2b
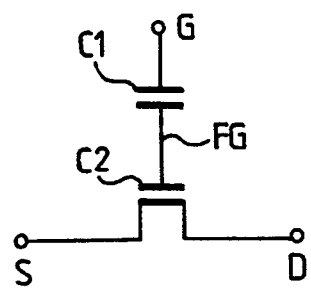
FIG_3a
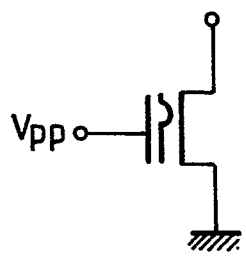
FIG_3b
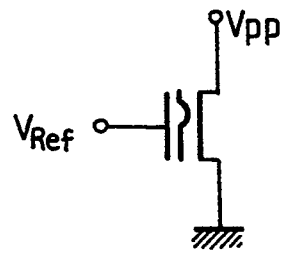

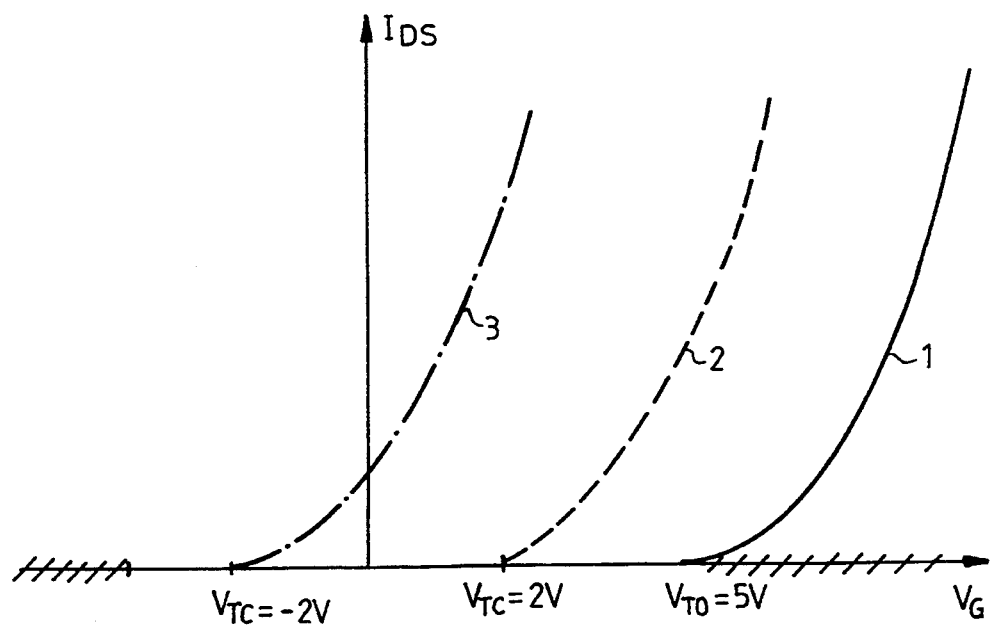
FIG_4
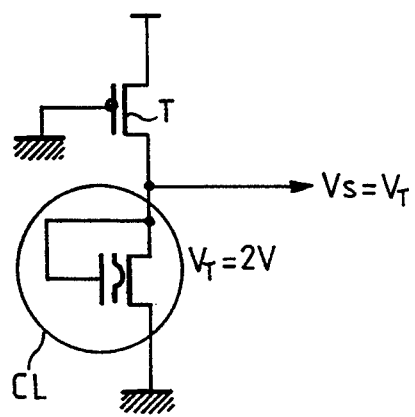
FIG_5
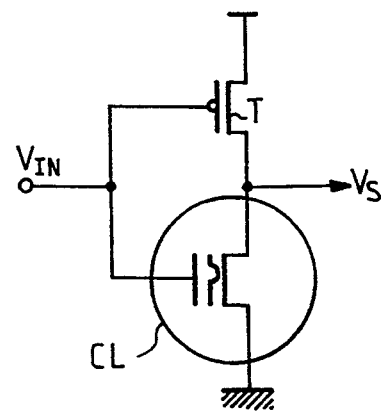
FIG_6

MOS INTEGRATED CIRCUIT WITH ADJUSTABLE THRESHOLD VOLTAGE

This application is a continuation of application Ser. No. 07/784,971, filed Oct. 30, 1991, which is a continuation of 07/551,446, filed Jul. 11, 1990, abandoned.

BACKGROUND OF THE INVENTION

1. Field of the Invention

The invention pertains to MOS (metal oxide semiconductor) integrated circuits and, more particularly, to integrated circuits in which the threshold voltage can be adjusted with precision.

2. Description of the Prior Art

MOS type integrated circuits use one or two types of transistors to achieve all the functions of the circuit. In the most recent technologies, these are n-type and p-type transistors. With these two types of transistors, it is very easily possible to fulfil all the logic functions, namely the functions using only logic gates and programmable logic arrays (PLAs).

The problems become more difficult to solve when the functions that have to be performed are outside the scope of standard logic. Now, most of the present-day circuits call for at least one variably analog function. This is the case, for example, with the power-on reset function. This is also the case with voltage level detectors, memory reading amplifiers, operational amplifiers, analog-digital or digital-analog converters, etc. All these circuits require analog reference voltages, and the problem lies in the precision of these references.

With standard integrated circuits, this precision is often very difficult to obtain owing to the variation in the parameters of the transistors depending on the different production batches from which they come. For, the working of a transistor in saturation mode can be described by an equation that expresses the drain current $I_D$, as a function notably of the voltage between the gate and the source $V_{GS}$, and of the threshold voltage $V_T$ of the transistor. All these parameters vary according to production batch, and it is impossible to achieve precise control of the value of the drain current as a function of the gate/source control voltage.

The problem is even more difficult when a circuit requiring high precision uses two types of transistors, namely transistors of the n-type and of the p-type. For, the electrical parameters of these two types of transistors may vary in opposite directions. This leads to major fluctuations in the working of circuits of this type. The parameter that has the greatest influence on the characteristics of the transistor is its threshold voltage. Now, this threshold voltage varies with the variation in the voltage of the source of the transistor. As a consequence, even if the threshold voltage $V_{TO}$ can be adjusted with precision when the source is connected to the ground, it is very difficult to obtain stable operating values in operating mode.

An object of the invention is a MOS cell in which the threshold voltage of the transistors is made adjustable.

SUMMARY OF THE INVENTION

According to the invention, there is proposed a MOS cell with adjustable voltage, formed by a cell of the type with a memory that is electrically-erasable and programmable by storage of charges by tunnel effect beneath a floating gate under the effect of an intense field, wherein the threshold voltage is adjusted, in a calibration phase, by storage of a predefined quantity of charges in the floating gate.

BRIEF DESCRIPTION OF THE DRAWINGS

The invention will be understood more clearly and other characteristics will appear from the following description, made with reference to the appended drawings.

FIG. 1 illustrates a circuit generating a simple reference voltage according to the prior art;

FIGS. 2a and 2b respectively illustrate a cross-sectional drawing of an electrically-erasable programmable cell and the equivalent electrical diagram;

FIGS. 3a and 3b illustrate the cell biased respectively during the two phases needed for the adjustment of the threshold voltage;

FIG. 4 illustrates the characteristic curve of the cell $I_{DS}=f(V_G)$ for different threshold voltages;

FIG. 5 illustrates a circuit for the generation of a reference voltage according to the invention; and FIG. 6 illustrates a circuit for the detection of an input level according to the invention.

DETAILED DESCRIPTION OF THE INVENTION

According to FIG. 1, which illustrates the prior art, to generate a reference voltage $V_{ref}$ equal to three times the threshold voltage of a transistor, three transistors $T_1$, $T_2$, $T_3$ are used. These three transistors are connected in series between the ground and the source of an output transistor T, the drain of which is connected to the supply voltage, the gate of this output transistor T being connected to the ground. Each of the transistors $T_1$, $T_2$ and $T_3$ has its drain connected to its gate. Under these conditions, it being assumed that the threshold voltage $V_{TO}$ is equal for these three transistors when the gate-source voltage of the transistors is zero, the output reference voltage is equal to the sum of the threshold voltages of the three transistors $V_{T1}+V_{T2}+V_{T3}$. Since the source voltage of the first transistor $T_1$ is zero, the threshold voltage $V_{T1}$ is equal to $V_{TO}$. By contrast, the source voltage of the transistor $T_2$ is equal to the threshold voltage $V_{T1}$. In the same way, the source voltage of the transistor $T_3$ is equal to the voltage $V_{T2}+V_{T1}$. As a consequence, the reference voltage $V_{ref}$ is:

$$V_{ref}=V_{TO}+(V_{TO}+AV_{TO})+(V_{TO}+B(V_{TO}+AV_{TO})$$
$$V_{ref}=V_{TO}(3+A+B+AB)$$

where A and B are the coefficients of variation of the thresholds of the transistors, as a function of the source voltage. These coefficients, related to the substrate effect may, as indicated above, vary greatly from one production batch to another. As a consequence, the output voltage varies too, and the voltage supposed to be a reference is not stable from one assembly to another. To obtain a stable reference voltage, the series of the three transistors would have to be replaced by a single transistor having a threshold voltage that is three times greater, and this threshold voltage would have to be stable.

An object of the invention is an integrated circuit in which there is "fabricated" a transistor having a threshold voltage that is perfectly known and adjustable in a wide range of voltage. To this end, the MOS integrated circuit according to the invention uses the basic structure of electrically-erasable programmable memory cells.

FIG. 2a illustrates the structure of an electrically-erasable programmable MOS memory cell of this type in an embodiment particularly well suited to the invention. This cell is formed by a P-type substrate in which N+ doped zones are implanted to form the source S and the drain D, the unit being covered with a silicon oxide layer and then with a polysilicon gate FG (called a floating gate because it is not connected) separated from a second polysilicon gate G by a second layer of silicon oxide. A contact is made on the gate G. The floating gate FG and the gate G are therefore stacked and partially cover the drain D. The gate G is separated from the drain only by the silicon oxide layer thinned to form a tunnel window. The working of a cell such as this is such that, by application of a high electrical field between the drain and the gate, charges go through the silicon oxide at the tunnel window and are stored in the floating gate FG. The equivalent electrical diagram shown in FIG. 2b shows the source S, the drain D, the capacitor of the transistor C2 and a coupling capacitor C1 between the floating gate FG and the control gate G. Thus, if the threshold of the transistor is equal to $V_{TO}$, the threshold of the memory cell is equal to:

$$V_{TC} = (C_1 + C_2)/C_1 \times V_{TO} = KV_{TO}$$

As indicated above, the threshold $V_{TO}$ is a technological parameter that cannot be modified.

A cell such as this has the property of enabling the storage of the charges, i.e. the erasure of the cell (state "1" where the transistor is on for a reading voltage $V_L$), then the elimination of the charges at the floating gate FG upon the programming of the cell (state "0" where the transistor is off for the reading voltage $V_L$). The storage of the charges is equivalent to the application of an initial voltage to the floating gate FG which shifts the characteristic curve $I_{DS} = F(V_G)$: thus if, for example, these charges are negative, a positive voltage will have to be applied to the control gate G to compensate for these charges. The threshold voltage is then:

$$V_{TC} = K(V_{TO} + V)$$

where V is the voltage of the floating gate when the control gate receives a zero voltage. This voltage V is due to the charges stored beneath the floating gate.

The result thereof is that, by a control of the charges stored in this gate, the threshold voltage of the device is controlled with precision.

It has been indicated above that "erasure" of the cell, namely the storage of the charges in the floating gate, is obtained by the application of a high electrical field between the gate and the drain, the charges being transferred by tunnel effect through the window provided for this purpose between the drain and the floating gate. For example, the programming is obtained by taking the control gate to the ground, the drain being taken to 20 volts, the thickness of the tunnel window being 0.01 micrometer. The source is then at a floating potential. For the erasure, the source is taken to the ground and the gate to the high potential (20 volts), the drain being unconnected: the previously stored charges are removed and the transistor is turned off. To obtain the circuit with variable threshold, a somewhat similar procedure is followed, in two phases. In a first phase, the source is grounded while the gate is taken to high voltage (about 20 volts): the electrons, if any, stored at the floating gate are removed and the threshold voltage is the voltage $V_{TO}$ of the order of 5 volts.

In a second phase, the source being still grounded, the gate is taken to a reference potential $V_{ref}$ and the drain is taken to the high programming voltage $V_{pp}$. The reference voltage is equal to the threshold voltage that it is desired to obtain.

The voltage $V_{pp}$ rises slowly until the instant when the tunnel effect is triggered. The charges then collect in the floating gate. When the number of charges is such that the threshold voltage reaches $V_{ref}$, the transistor starts being conductive. The current that appears at the drain causes a drop in the programming voltage $V_{pp}$ and this voltage then stops increasing. The charges are trapped and the terminals of the cell can be disconnected. The threshold voltage value thus obtained is very precise and independent of the technological parameters related to the method of manufacturing the circuit.

FIG. 4 illustrates the characteristics of the cell, firstly with its initial threshold voltage $V_{TO} = 5$ volts for example (curve 1), when there are no charges stored beneath the floating gate and $V_G = V_0$, then with a threshold voltage $V_{TC} = 2$ volts, the reference voltage applied to the gate having been taken to $V_{ref} = 2$ volts (curve 2), then with a threshold voltage $V_{TC} = -2$ volts, the reference voltage applied to the gate being $V_{ref} = -2$ volts (curve 3).

A MOS integrated circuit such as this, with adjustable threshold voltage, can be used for a great many applications. Two examples are given with reference to FIGS. 5 and 6. FIG. 5 illustrates an application wherein the cell with adjustable threshold voltage is used to obtain a fixed reference voltage. For this purpose, the cell CL, with the charges stored so that the threshold voltage $V_T = 2$ volts, is connected between the source of the output MOS transistor T and the ground, the gate of the cell being connected to its drain. The gate of the transistor T is connected to the ground and its drain is connected to a supply voltage. Thus, the output voltage $V_S$ at the drain of the output transistor T is equal to the threshold voltage, $V_T = 2$ volts, of the cell. As indicated above, before its use, to set a reference voltage, the cell is calibrated during a prior calibration in two phases.

FIG. 6 shows a second mode of use of the above-described cell with adjustable threshold voltage in a voltage detection circuit. The circuit has a cell CL programmed by storage of charges at the floating gate so that its threshold voltage $V_T = 2$ volts for example. The drain of the cell CL is connected to the drain of an output transistor T, and its source is connected to the ground, the source of the output transistor T being connected to a supply voltage, and the two gates of the cell, on the one hand, and of the transistor T, on the other hand, being connected to an input terminal designed to receive the voltage to be detected $V_{IN}$. This circuit works as follows. So long as the voltage $V_{IN}$ is below the threshold $V_T$, the cell is not conductive and the output voltage $V_s$ is the supply voltage of the circuit. As soon as the voltage $V_{IN}$ becomes higher than the threshold $V_T$, the cell is conductive and the output voltage $V_S$ diminishes. The working of this circuit can therefore be analysed like that of an inverter which causes the output to switch over as soon as the input voltage goes beyond the threshold voltage $V_T$. A circuit such as this can be used notably to make analog-digital converters or for the shifting of voltage levels.

A third example of the use of a cell such as this with adjustable threshold voltage is the making of depleted transistors with negative threshold voltage $V_T$ without requiring masks and additional manufacturing steps. For, in CMOS circuits, the use 6f depleted transistors may considerably simplify the structures of the circuit. But, in a circuit having several thousands of transistors, only one depleted transistor may be necessary. The above-described cell enables the threshold voltage to be adjusted to a negative value as well as to a positive value.

A great advantage of the invention is related to the fact that the threshold voltage is very precise and that its value can be quite analog, i.e. adjusted to any value chosen in the range of −4 volts to 5 volts for example.

The invention is not restricted to the applications precisely described above. In particular, all circuits requiring the control of functions based on the detection of certain input levels may be made with such cells wherein the threshold voltage is adjusted.

What is claimed is:

1. A method for operating a MOS cell for providing an adjustable reference voltage, said reference voltage being designed to be compared with an unknown voltage to distinguish either said unknown voltage is lower or greater than said reference voltage, said method comprising the steps of:

a cell of the type with a memory transistor that is electrically-erasable and programmable by storage of charges by tunnel effect into a floating gate of said memory transistor, under the effect of an intense field, is integrated in an integrated circuit;

said integrated circuit is permanently connected to a supply voltage and also to a ground voltage, a conduction threshold voltage of said cell is adjusted, in a calibration phase, by storing a predefined quantity of charges into said floating gate of said memory transistor;

said calibration phase comprising the connection of a control gate of said memory transistor to a voltage Vref supply and the connection of its drain and source between respectively a programming high voltage supply and said ground voltage, the voltage value Vref equals said desired adjustable reference voltage, said Vref voltage being different from said ground voltage, from said programming high voltage, and from said supply voltage, during said calibration phase the potential difference between the source and drain on said memory transistor increases till it does no more increase, at this time a tunnel effect is set in the cell, the charges then accumulating in the floating gate, the transistor of the cell commencing to conduct and the current which occurs on the drain causing a fall in the programming voltage which cease to increase, at that time the conduction threshold voltage of said cell is spontaneously adjusted to the value of the desired adjustable reference voltage, said conduction threshold voltage of said memory transistor is utilised as said adjustable reference voltage.

2. A method according to claim 1 wherein the adjustment of the threshold of the cell is done in two phases:

a first phase, an erasing phase, during which an electrical field, at least equal in value to the field needed for the storage by tunnel effect, being applied between a control gate and a source of said transistor, the cell having its source connected to said ground voltage and its control gate connected to said high programming voltage;

said calibration phase following said first phase.

3. Process for producing an adjustable threshold voltage, comprising the following steps: a cell of the memory type is selected in an integrated circuit, this cell of the memory type being of the type having a floating gate transistor which is programmable and erasable electrically by the storage of charges through the tunnel effect in the floating gate of said transistor, under the effect of an intense field, a memory cell of this type being readable by exposing one of the terminals of this cell to a reading potential, the read state being deduced from whether or not this floating gate transistor is rendered conductive, the integrated circuit being permanently connected on the one hand to a supply voltage and on the other hand to earth potential; wherein the source of this floating gate transistor is brought to an earth potential, the control gate of this floating gate transistor is brought to a reference voltage used to determine a desired threshold voltage, and the drain of this floating gate transistor is brought to a high programming voltage; the threshold voltage being then adjusted in a calibration phase by the storage of a predefined quantity of charges under the floating gate, in which phase the programming voltage increases until the moment when the tunnel effect is set up, the charges then accumulating under the floating gate, the transistor then commencing to conduct and the current which occurs on the drain causing a fall in the programming voltage, which ceases to increase, the threshold voltage being obtained in this manner.

4. Process in accordance with claim 3, wherein the control grid of said cell is connected to its drain and said cell is fed between the earth-potential and the supply voltage with a transistor connected thereto in series.

5. Process in accordance with claim 3, wherein the control gate of the floating grid transistor is then connected to a control gate of a control transistor, while the drain of the floating gate transistor of this cell is connected to the drain of said control transistor, and said cell is fed in series with this control transistor, between the earth and a supply voltage, the connected control gates are subjected to a voltage to be tested, this assembly supplying at its output a signal which represents a comparison of this voltage to be tested with the value of said threshold voltage of the said floating gate transistor.

6. Process in accordance with claim 3, wherein the threshold voltage is adjusted in two phases:

a first phase in the course of which a predefined quantity of charges is stored in the floating gate, an electrical field at least equal to the field required for the transfer by the tunnel effect being applied in a window, the source of the cell being put at earth potential and its control gate put at a high programming voltage, and a second phase in the course of which the control gate of the cell is brought to a reference ($V_{ref}$) equal to the desired threshold voltage ($V_{TC}$), its source being put at an earth potential and its drain being brought to the said high programming voltage.

7. Process in accordance with claim 4, wherein the threshold voltage is adjusted in two phases:

a first phase in the course of which a predefined quantity of charges is stored in the floating gate, an electrical field at least equal to the field required for the transfer by the tunnel effect being applied in a window, the source of the cell being put at earth potential and its control gate put at a high programming voltage, and a second phase in the course of which the control gate of the cell is brought to a reference ($V_{ref}$) equal to the desired threshold voltage ($V_{TC}$), its source being put at an earth potential and its drain being brought to the said high programming voltage.

8. Process in accordance with claim 5, wherein the threshold voltage is adjusted in two phases:

a first phase in the course of which a predefined quantity of charges is stored in the floating gate, an electrical field at least equal to the field required for the transfer by the tunnel effect being applied in a window, the source of the cell being put at earth potential and its control grid put at a high programming voltage, and a second phase in the course of which the control gate of the cell is brought to a reference ($V_{ref}$) equal to the desired threshold voltage ($V_{TC}$), its source being put at an earth potential and its drain being brought to the said high programming voltage.

* * * * *